United States Patent [19]

Sarr et al.

[11] Patent Number: 5,021,740
[45] Date of Patent: Jun. 4, 1991

[54] METHOD AND APPARATUS FOR MEASURING THE DISTANCE BETWEEN A BODY AND A CAPACITANCE PROBE

[75] Inventors: Dennis P. Sarr, Kent; Patrick L. Anderson, Bellevue, both of Wash.

[73] Assignee: The Boeing Company, Seattle, Wash.

[21] Appl. No.: 320,315

[22] Filed: Mar. 7, 1989

[51] Int. Cl.$^5$ .............................. G01R 27/26
[52] U.S. Cl. .................................. 324/687; 324/662; 324/678; 324/688; 324/679
[58] Field of Search .............. 324/61 R, 61 P, 60 CD, 324/661, 662, 678, 679, 687, 686, 688, 690; 340/870.37

[56] References Cited

U.S. PATENT DOCUMENTS

| | | | |
|---|---|---|---|
| Re. 27,829 | 12/1973 | Tiffany | 307/118 |
| 2,930,976 | 3/1960 | Hirdler | 324/61 R |
| 3,000,101 | 9/1961 | Giardino et al. | 33/143 |
| 3,206,857 | 9/1965 | Kaye | 33/174 |
| 3,815,020 | 6/1974 | Mayer | 324/61 R |
| 3,947,760 | 3/1976 | Noguchi et al. | 324/57 R |
| 4,065,715 | 12/1977 | Jaffe et al. | 324/60 CP |
| 4,112,355 | 9/1978 | Gibson, Jr. et al. | 324/57 R |
| 4,339,709 | 7/1982 | Brihier | 324/61 R |
| 4,339,750 | 7/1982 | Delacruz | 340/870.37 |
| 4,414,508 | 11/1983 | Davis et al. | 324/238 |
| 4,429,272 | 1/1984 | Bungay | 324/61 R |
| 4,459,541 | 7/1984 | Fielden et al. | 324/60 CD |
| 4,634,965 | 1/1987 | Foote | 324/60 C |
| 4,642,555 | 2/1987 | Swartz et al. | 324/60 C |
| 4,814,691 | 3/1989 | Garbini et al. | 324/61 R |

FOREIGN PATENT DOCUMENTS 137490 9/1979 German Democratic Rep.
939660 11/1960 United Kingdom.

OTHER PUBLICATIONS

Getex, You Can Make 192 Quality Checks on Any One of These Holes in Just 3 Seconds, Jan. 2, 1986, 15 pgs.

Primary Examiner—Gerard R. Strecker
Assistant Examiner—Jack B. Harvey
Attorney, Agent, or Firm—Christensen, O'Connor, Johnson & Kindness

[57] ABSTRACT

A distance-measuring apparatus for measuring the distance between a capacitance-type sensing probe (60) and a nearby surface of a conductive body is provided. A probe (60) includes a plurality of measuring electrodes ($56_1$-$56_n$) and a grounding electrode (58). The grounding electrode protrudes from the probe and grounds the nearby surface of the conductive body. A control system (10) is connected to the probe (60). A processor (12) issues control instructions, $S_{CTL}$, to a selector (16). The selector (16) selects one of a plurality of measuring electrodes ($56_1$-$56_n$) and connects the selected electrode to a converter (14). A charging circuit (18) applies a charging voltage to the selected electrode, causing a capacitor formed by the selected electrode and the nearby surface of the conductive body to charge up. A timing circuit (22) starts a counter (32) when one of the measuring electrodes ($56_1$-$56_n$) is selected and stops the counter (32) when a capacitor charge voltage, $V''_C$, becomes greater than or equal to a threshold voltage, $V_T$. The counter (32) counts clock pulses, $V_{CK}$, produced by a clock (34) and produces a count value, $S_{CNT}$, that is proportional to the charge time of the capacitor. The processor (12) translates the $S_{CNT}$ value into a distance value corresponding to the distance between the sensing probe (60) and the nearby surface of the body being inspected.

14 Claims, 3 Drawing Sheets

METHOD AND APPARATUS FOR MEASURING THE DISTANCE BETWEEN A BODY AND A CAPACITANCE PROBE

FIELD OF THE INVENTION

This invention relates to distance measuring equipment and, more particularly, to a method and apparatus for measuring the distance between a capacitance-type sensing probe and the surface of a conductive body.

BACKGROUND OF THE INVENTION

Capacitance techniques are commonly employed by distance measuring apparatus to inspect cavities and surfaces of conductive bodies for irregularities and imperfections. Typical capacitance-type distance measuring apparatus have two parts: a capacitance-type sensing probe; and, an electronic control system. The capacitance-type sensing probe includes electrodes that, in conjunction with the surface of a body being inspected, form capacitors that are used to make distance measurements. The electronic control system usually contains circuitry for applying charging voltages to the electrodes in the sensing probe and circuitry for translating capacitance-related signals into distance values. More specifically, a capacitance-type distance measuring apparatus measures the capacitance between the probe and the body being inspected. Once the capacitance is determined, the electronic control system translates the capacitance into a distance value. A capacitance-to-distance translation is relatively simple and straightforward and is based upon the inverse relationship that exists between capacitance and the distance between the plates that form a capacitor. Various physical characteristics of a body, such as size and shape can be determined from a suitable number of distance values.

A capacitance-type distance measuring apparatus that has found widespread use in the aircraft industry uses a parallel plate capacitance technique to inspect aircraft parts. However, another technique known as a fringe field capacitance technique offers certain advantages over the plate capacitance technique. These advantages, which include smaller sensing probes and more precise measurements, allow fringe field capacitance probes to be used to determine whether small cavities in aircraft parts are within exacting engineering specifications.

Capacitance values associated with fringe field capacitance probes are typically quite small—such as one-tenth of a picofarad. Accordingly, the electronic control systems of distance measuring apparatus must be sensitive to capacitance-related signals that are also quite small. The electronic control systems of prior art distance measuring apparatus have used methods such as circuit resonance, diode twin-T balancing, frequency modulation, phase-locked loop, and pulse width modulation to measure the capacitance between a probe and a conductive body being inspected. All of these prior art methods have inherent problems. For example, the circuit resonance method of capacitance measurement is most effective for signals within a narrow bandwidth. The narrow bandwidth limits the range of capacitance values that can be measured. Additionally, if a digital output signal is required, the circuit resonance method requires a complex analog-to-digital conversion. Diode twin-T circuits require substantial signal amplification that may introduce noise or other extraneous signals into the signal being measured. In addition, variations between the operating characteristics of diodes may require ongoing calibration of diode twin-T circuits. Frequency modulation and pulse width modulation methods experience oscillator stability problems and, when a digital output signal is required, involve complex analog-to-digital signal conversions. Phase-locked loop circuits behave nonlinearly over a wide range of capacitance values and are not well suited for measuring low values of capacitance, such as those created by fringe field capacitance probes.

As will be appreciated from the foregoing discussion, there has developed a need in the aircraft industry, as well as in other industries, for a method and apparatus that will accurately, reliably, and inexpensively measure the distance between a capacitance-type sensing probe, such as a fringe field capacitance probe, and a conductive body. The present invention provides a method and apparatus that computes the charge times of capacitors formed by the sensing probe and a nearby surface of the body in a manner that achieves these results.

SUMMARY OF THE INVENTION

In accordance with this invention, a method and apparatus for determining the distance between a conductive body and a capacitance-type sensing probe is provided. The apparatus of the present invention comprises: a capacitance-type sensing probe; and, a control system. The probe comprises a plurality of measuring electrodes and a grounding electrode. The control system comprises: a selector; a converter; and, a processor. The selector is coupled to the plurality of measuring electrodes and to the grounding electrode. The processor issues control instructions that instruct the selector to select one of the plurality of measuring electrodes. The selected electrode is coupled to the converter. The selected electrode forms a capacitor with a nearby grounded surface of the conductive body and, thus, provides an associated capacitance value to the converter. The converter converts the associated capacitance value into a proportional time-related signal and applies the time-related signal to the processor. The processor translates the time-related signal into a distance value that is substantially equal to the distance between the capacitance-type sensing probe and the surface of the conductive body.

In accordance with further aspects of the present invention, the selector includes a decoder and a mutliplexer. The decoder decodes the control instructions from the processor and issues a selection address to the multiplexer. The multiplexer is connected to the plurality of measuring electrodes and the grounding electrode. The selection address instructs the multiplexer to select one of the plurality of measuring electrodes and connect the selected electrode to the converter.

In accordance with still further aspects of the invention, the converter includes a charging circuit and a timing circuit. The charging circuit applies a charging voltage to the selected electrode and charges up the associated capacitor. The timing circuit determines the time it takes the associated capacitor to charge up to a threshold voltage. A counter in the timing circuit starts counting when one of the plurality of measuring electrodes is selected and stops counting when the capacitor charging voltage equals or exceeds the threshold voltage. The count value produced by the counter forms the time-related signal that is translated into a distance value by the processor.

In accordance with still further aspects of the present invention, the method of the present invention comprises the steps of: selecting a measurement electrode of a multiple electrode capacitance-type sensing probe; converting the capacitance between the selected electrode and a nearby surface of a conductive body into a time-related signal; and, translating the time-related signal into a distance value. The converting step further comprises the substeps of: counting clock pulses starting when a measurement electrode is selected and a charging voltage is applied to the capacitor formed by the selected electrode and the nearby surface of the conductive body and stopping the counting of the clock pulses when a capacitor charge voltage equals or exceeds a threshold voltage; and, producing a time-related signal in the form of the number of counted clock pulses.

In accordance with further aspects of the invention, the selecting, converting, and translating steps are performed for a plurality of measurement electrodes in the multiple electrode sensing probe.

In accordance with still further aspects of the invention, the converting step is performed a multiple number of times and results in a multiple number of time-related signals for each selected electrode. The converting step further comprises the steps of averaging the multiple time-related signals and producing an average time-related signal for each selected electrode.

As will be appreciated from the foregoing summary, the present invention provides a method and apparatus for measuring the distance between a capacitance-type sensing probe and the surface of a conductive body. The charge time of a capacitor formed by an electrode in the capacitance-type sensing probe and the nearby surface of the conductive body is translated into a measurement of the distance between the sensing probe and the surface of the conductive body.

BRIEF DESCRIPTION OF THE DRAWINGS

The foregoing and other features and advantages of the present invention will become better understood by reference to the following detailed description when taken in conjunction with the accompanying drawings, wherein.

DETAILED DESCRIPTION OF THE PREFERRED EMBODIMENT

There has developed a need in the aircraft industry, as well as in other industries that perform inspections with capacitance-type sensing probes, for a method and apparatus that can accurately and reliably determine the distance between the sensing probe and the surface of a conductive body. The present invention provides a method and apparatus that uses the charge times of capacitors formed between the sensing probe and a nearby surface of the conductive body to achieve these results. As will be understood from the following discussion, while the preferred embodiment of the present invention disclosed herein was designed for use with a fringe field capacitance probe, the invention can be used with other types of capacitance probes, such as plate capacitance probes.

Figure 1:
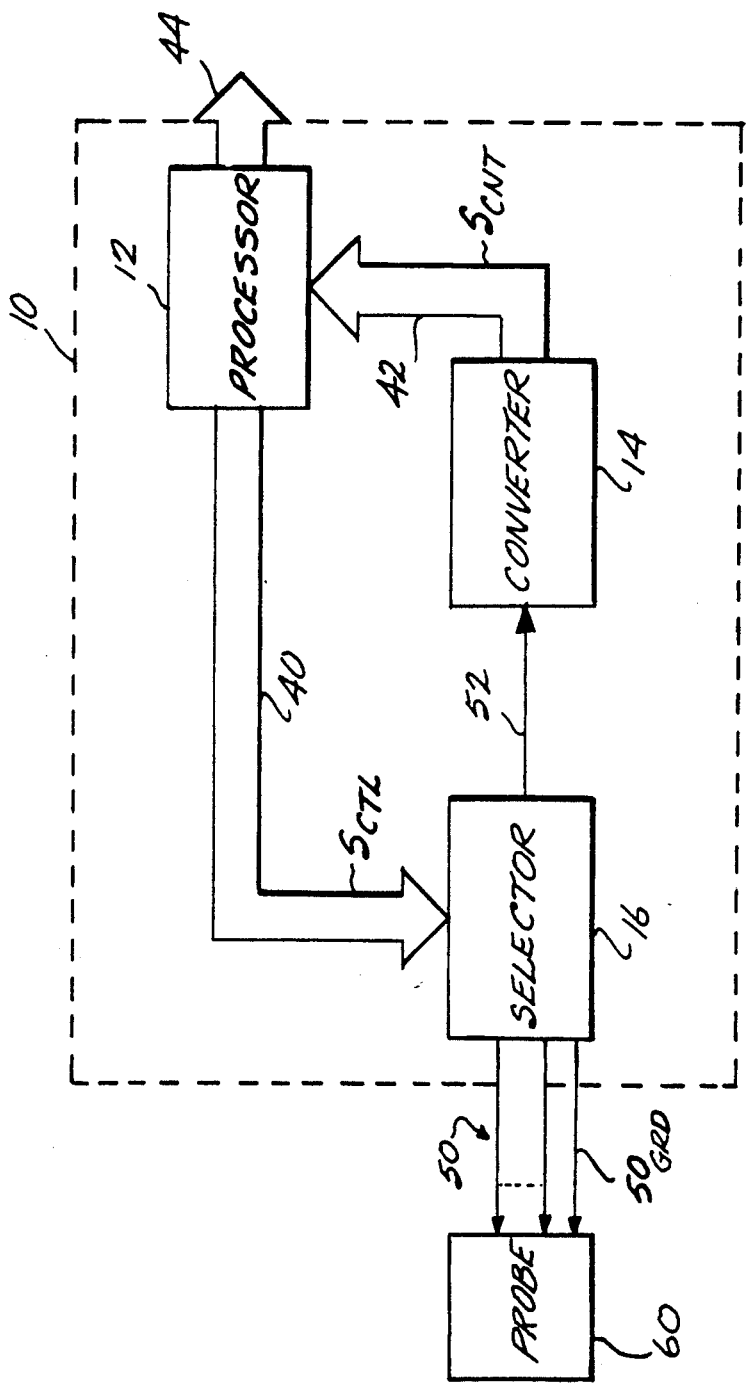
FIG. 1 is a simplified functional block diagram of a distance measuring apparatus formed in accordance with the present invention.

FIG. 1 is a functional block diagram illustrating the presently preferred embodiment of the invention. More specifically, FIG. 1 illustrates, in block form, a distance measuring apparatus comprising an electronic control system 10 and a capacitance-type sensing probe 60. The electronic control system 10 comprises: a processor 12; a selector 16; and, a converter 14. A data output port of the processor 12 is connected to an input of the selector 16 via a data bus 40. The output of the selector is connected to the input of the converter 14. The output of the converter is connected to a data input port of the processor 12 via a data bus 42.

The capacitance-type sensing probe 60, which will be discussed in greater detail below, comprises: a plurality of measuring electrodes (not shown); and, a grounding electrode (also not shown). When the probe 60 is placed near the surface of a conductive body the grounding electrode is brought into contact with and, thereby, grounds the conductive body. An example of a capacitance-type sensing probe that is suitable for use in the apparatus of the present invention can be found in a contemporaneously filed U.S. patent application Ser. No. 07/320,314, entitled "Probe for Inspecting Countersunk Holes in Conductive Bodies," by Patrick L. Anderson, Dennis P. Sarr, and Mark B. Simpson, the subject matter of which is incorporated herein by reference.

The plurality of measuring electrode in the probe 60 are connected to the selector 16 by a plurality of measuring leads 50. The grounding electrode is connected to the selector 16 by a ground lead $50_{GRD}$. A capacitor is formed between each of the measuring electrodes in the sensing probe 60 and a nearby grounded surface of the part to be inspected. Each capacitor thusly formed provides an associated capacitance value to the selector 16 by way of the ground lead $50_{GRD}$ and one of the measuring leads 50.

As will be more fully discussed below, the processor 12 receives instructions from a user-supplied program and, in accordance with these instructions, issues control instructions, denoted $S_{CTL}$, to the selector 16 via the data bus 40. The $S_{CTL}$ instruction instruct the selector 16 to select one of the measuring electrodes. A selected one of the electrodes, hereinafter referred to as a selected electrode, is connected to the input of the converter 14. The remaining measuring electrodes, i.e., the nonselected electrodes, are, preferably, held at ground potential to reduce the effects of cross-talk and cross-capacitance with the selected electrode. The converter 14 produces an output signal that is proportional to the capacitance value associated with the selected electrode. More specifically, and as will become better understood from the following discussion, the converter 14 applies to a charging voltage to the selected electrode and causes the associated capacitor the charge up. As is well known, the charge time of a capacitor is inversely proportional to the distance between plates of the capacitor. In this case, the charge time of the capacitor associated with the selected electrode is inversely proportional to the distance between the sensing probe 60 and the nearby grounded surface of the conductive body being inspected. The converter 14 produces a time-related signal, denote $S_{CNT}$, that is proportional to the time it takes the associated capacitor to charge up to a predetermined threshold value. Preferably, the $S_{CNT}$ signal is a digital signal, such as a digital count value, that is applied to the processor 12 via the data bus 42.

After the processor 12 receives a $S_{CNT}$ signal from the converter 14, new control instructions, $S_{CTL}$, are issued to the selector 16 and a next one of the measuring electrodes is selected. The next selected electrode is connected to the converter 14. The converter 14 performs the charging and timing functions in the manner discussed above, and applies the resulting $S_{CNT}$ signal to the processor 12. Preferably, these steps are repeated for each of the measuring electrodes in the probe 60 that are connected to the selector 16.

In certain situations it may be desirable to produce multiple $S_{CNT}$ signals for each selected electrode and determine an average $S_{CNT}$ value for each selected electrode. In this case, the processor 12 may instruct the selector 16 to select the same one of the measuring electrodes a number of times (such as 100 times, for example), before selecting a next one of the measuring electrodes. Thus, in this example, the converter 14 produces 100 $S_{CNT}$ signals for each selected electrode. The processor 12 determines an average $S_{CNT}$ value for each selected electrode.

As will become better understood from the following discussion, the processor 12 analyzes the $S_{CNT}$ signals and determines whether the conductive body, or more specifically, a cavity, such as a countersunk hole, in the conductive body, is within engineering specification. If, for example, the dimensions and orientation of a countersunk hole are within the engineering specifications, the processor 12 will issue an ACCEPT signal via bus 44. If, however, the dimensions or orientation of the countersunk hole are not within the engineering specifications, a REJECT signal is issued. Preferably, when a REJECT signal is issued, the processor 12 will provide the user with additional error messages that specify the particular problem or problems with the countersunk hole.

Figure 2:
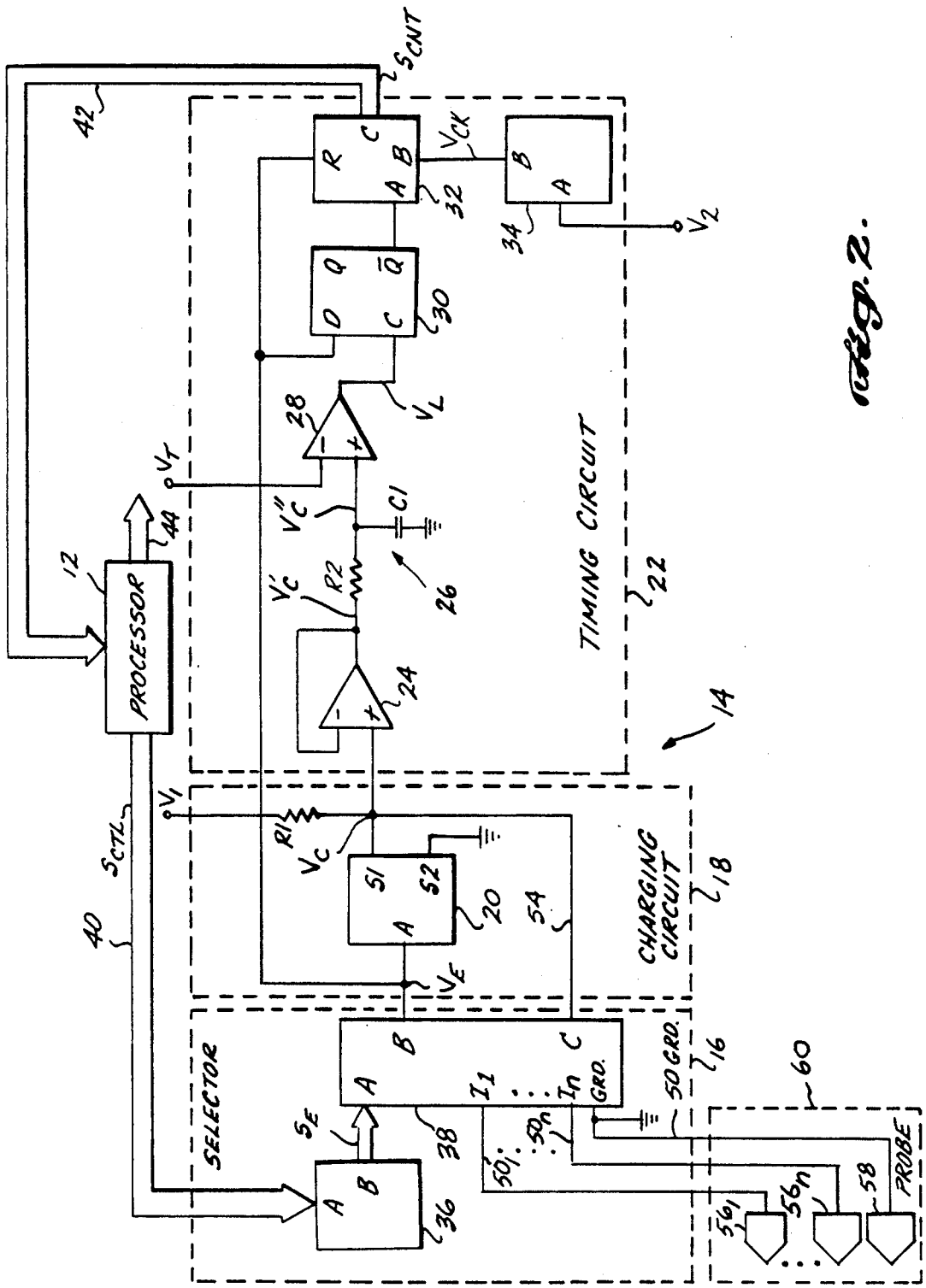
FIG. 2 is a schematic diagram of a preferred embodiment of the distance measuring apparatus depicted in FIG. 2; and, FIG. 3 is a simplified flow chart illustrating the functional steps of a program suitable for controlling the processor of the apparatus depicted in FIG. 1.

FIG. 2 is a schematic diagram of the distance measuring apparatus illustrated in FIG. 1 and discussed above. The selector 16 comprises: a decoder 36; and, a multiplexer 38. The converter 14 comprises: a charging circuit 18; and, a timing circuit 22. As will become better understood from the following discussion, the decoder 36 decodes instructions from the processor 12 and issues appropriate electrode selection instructions to the multiplexer 38; the multiplexer 38 connects a selected electrode to the converter 14 and, in response to the selection instructions from the microprocessor 38, applies a control signal to the converter; the charging circuit 18 applies a capacitor charging voltage to the selected electrode; the timing circuit 22 determines the time it takes a capacitor associated with the selected electrode to charge up to a predetermined value and produces a time-related signal that is proportional to the charge time of the capacitor.

The decoder 36 has a control input, A, and an output, B. The multiplexer 38 has: a control input, A; a plurality of analog inputs, $I_1$–$I_n$; a ground input, G; a logic output, B; and, an analog output, C. The control instructions, $S_{CTL}$, are applied to the control input, A, of the decoder 36 via the data bus 40. The output, B, of the decoder 36 is connected to the data input, A, of the multiplexer 38. As will become better understood from the following discussion, a plurality of measuring leads $50_1$–$50_n$ are connected to the analog inputs, $I_1$–$I_n$, of the multiplexer 38. A grounding lead $50_{GRD}$ is connected to the ground input, G.

The charging circuit 18 comprises: a solid state switch 20; and, a resistor, designated R1. The switch 20 has: a control input, A; an analog input, S1; and, an analog output, S2. The data output, B, of the multiplexer 38 is connected to the control input, A, of the switch 20. The analog output, C, of the multiplexer 38 is connected to the S1 input and to one end of R1. The other end of R1 is connected to a positive voltage source, designated $V_1$. The S2 output is connected to ground.

The timing circuit 22 comprises: a high impedance buffer 24; a low pass filter 26; a comparator 28; a type-D flip-flop 30; a digital counter 32; and a clock 34. The low pass filter 26 further comprises: a resistor, designated R1; and, capacitor, designated C1. The flip-flop 30 has: a data input, D; a clock input, C; and, outputs, Q and $\overline{Q}$. The counter 32 has: a control input, A; a data input, B; a reset input, R; and, an output, C. The clock 34 has a power input, A, and an output, B.

The analog input, S1, of the switch 20 is connected to the noninverting input of the buffer 24. The output of the buffer 24 is connected to the inverting input of the buffer 24 and to one end of R2. The other end of R2 is connected to the noninverting input of the comparator 28 and to ground through C1. The inverting input of the comparator 28 is connected to a positive threshold voltage source, designated $V_T$. The output of the comparator 28 is connected to the clock input, C, of the flip-flop 30. The data output, B, of the multiplexer 38 is connected to the data input, D, of the flip-flop 30 and to the reset input, R, of the counter 32. The $\overline{Q}$ output of the flip-flop 30 is connected to the control input, A, of the counter 32. The Q output is unconnected. The power input, A, of the clock 34 is connected to a positive voltage source, designated $V_2$. The output, B, of the clock 34 is connected to the data input, B, of the counter 32. The output, C, of the counter 32 is connected to the processor 12 via the data bus 42.

The capacitance-type sensing probe 60, illustrated in FIG. 2, is preferably a low capacitance-type sensing probe, such as a fringe field capacitance probe, for example. The probe 60 comprises a plurality of measuring electrodes $56_1$–$56_n$; and, a grounding electrode 58. An example of such a capacitance-type sensing probe can be found in the contemporaneously filed U.S. patent application Ser. No. 07/320,314, reference above, entitled "Probe for Inspecting Countersink Holes in Conductive Bodies," by Patrick L. Anderson, Dennis P. Sarr, and Mark B. Simpson, the subject matter of which is incorporated herein by reference.

As noted above, the measuring electrodes $56_1$–$56_n$ are connected to the inputs $I_1$–$I_n$ of the multiplexer 38 by the measuring leads $50_1$–$50_n$, respectively, and the grounding electrode 58 is connected to the ground input, G, by the grounding lead $50_{GRD}$. When the probe 60 is positioned in close proximity of the conductive body the grounding electrode 58 contacts a surface of the body, and, thereby, grounds the body. In accordance with the above example, each of the measuring electrodes $56_1$–$56_n$ forms a fringe field capacitor with the nearby grounded surface of the conductive body being inspected. Each of the leads $50_1$–$50_n$ provides an associated fringe field capacitance value to the multiplexer 38. The associated capacitance values are inversely proportional to the distance between the respective measuring electrodes $56_1$–$56_n$ and the nearby grounded surface of the conductive body. The fringe field capacitance values that exist between the fringe field capacitance probe 60 and the conductive body are typically small and may lie in the picofarad range.

The operation of the distance measuring apparatus depicted in FIG. 2 is discussed next. The decoder 36 decodes the control instructions, $S_{CTL}$, from the processor 12 and produces a measuring electrode selection address, denoted $S_E$. The $S_E$ address is applied to the control input, A, of multiplexer 38 and instructs the multiplexer 38 to select an appropriate one of the measuring electrodes $56_1$–$56_n$, and to connect the selected electrode to the output, C. At the same time, the nonselected electrodes are held at ground potential to reduce the effects of cross-talk and cross-capacitance, with the selected electrode. The multiplexer 38 produces a logic voltage, denoted $V_E$, at the logic output, B. Preferably, the $V_E$ voltage is low when an $S_E$ address is applied to the A input of the multiplexer 38. Contrariwise, the $V_E$ voltage is preferably high when an $S_E$ address is not applied to the A input of the multiplexer 38.

The $V_E$ voltage is applied to: the control input, A, of the switch 20; to the D input of the flip-flop 30; and, to the reset input, R, of the counter 32. A high $V_E$ voltage causes the switch 20 to close, and, thereby, connect the S1 input to the S2 output. Closing the switch 20 grounds the C output of the multiplexer 38 and, hence, grounds the selected electrode. Conversely, a low $V_E$ voltage causes the switch 20 to open and disconnect the S1 input from the S2 output. When this happens, $V_1$ begins to charge the fringe field capacitor associated with the selected electrode through R1. As the associated capacitor begins to charge, a capacitor charge voltage, denoted $V_C$, is formed at the S1 input of switch 20. The $V_C$ voltage increases as the associated capacitor charges up. Contrariwise, when the S1 input is connected to the S2 output (i.e., to ground), $V_C$ decays to zero.

The $V_C$ voltage is applied to the buffer 24. A buffered $V_C$ voltage, denoted $V'_C$, is formed at the output of the buffer 24. The $V'_C$ voltage is isolated from extraneous signals by the high impedance of the buffer 24. The $V'_C$ voltage is filtered by the low pass filter 26 to remove undesirable high-frequency disturbances, such as switching jitter produced by the switch 20. A filtered capacitor charging voltage, denoted $V''_C$, is formed at the noninverting input of the comparator 28. The comparator 28 compares the $V''_C$ voltage with the threshold voltage, $V_T$, and produces a logic output voltage, denoted $V_L$. The $V_L$ voltage is low when the filtered capacitor charge voltage is less than the threshold voltage (i.e., $V''_C < V_T$). When the filtered capacitor voltage becomes greater than or equal to the threshold voltage (i.e., $V''_C \geq V_T$), the comparator 28 shifts states and produces a high $V_L$ voltage. The $V_L$ voltage is applied to the clock input, C, of the flip-flop 30. Thus, the output of the comparator 28, $V_L$, clocks the flip-flop 30.

The flip-flop 30 and counter 32 operate in the manner set forth next. The counter 32 counts clock pulses, denoted $V_{CK}$, that are produced by the clock 34 and applied to the B input of the counter 32. As discussed above, the $V_E$ voltage goes low when an $S_E$ address is applied to the A input of the multiplexer 38. The low $V_E$ voltage, is applied to the R input of the counter 32, causing the counter 32 to reset and continue counting $V_{CK}$ pulses. The low $V_E$ voltage also causes the switch 20 to open and allows the capacitor associated with the selected electrode to charge up to a value of $V_C$. When $V''_C$ equals or exceeds $V_T$, the comparator 28 shifts states and produces a high $V_L$ voltage. The high $V_L$ voltage toggles the flip-flop 30 and causes the $\overline{Q}$ output to go low, which stops the counter 32 from counting $V_{CK}$ pulses. The count value, $S_{CNT}$, is formed at the C output of the counter 32 and represents the number of $V_{CK}$ pulses counted by the counter 32. Thus, the $S_{CNT}$ value represents the time it takes the fringe field capacitor associated with the selected electrode to charge up to the threshold voltage, $V_T$. As discussed above, the $S_{CNT}$ value is applied to the processor 12. The operations performed by the processor 12 are discussed below.

Figure 3:
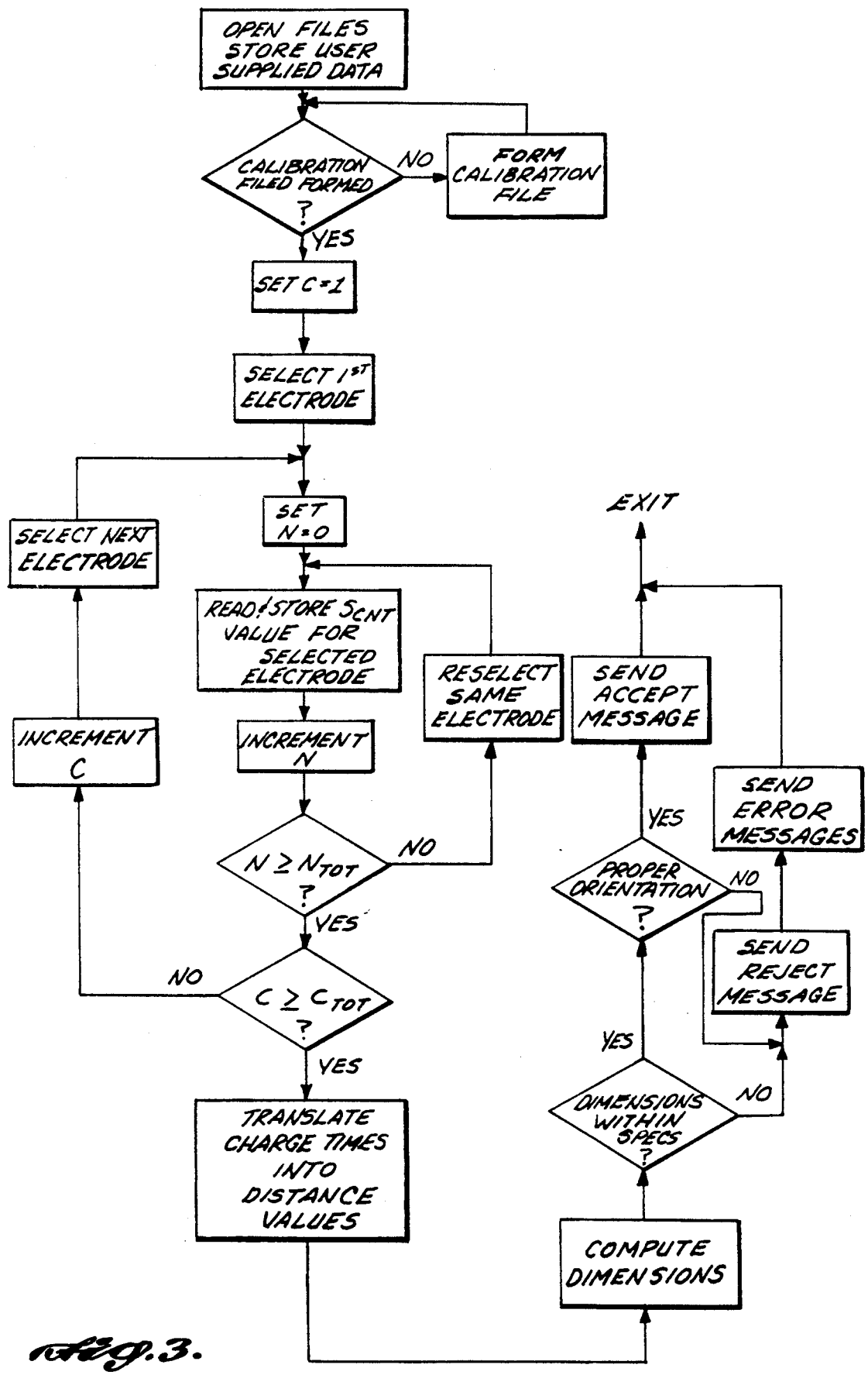

FIG. 3 illustrates the functional steps of a program used to control the processor 12. For ease of understanding the present invention, the program is discussed in terms of a particular aircraft industry use of the distance measuring apparatus 10. More specifically, a fastener-shaped, fringe field capacitance probe having sixteen measuring electrodes and one grounding electrode is used to inspect countersunk holes in conductive aircraft parts. An example of such a capacitance-type sensing probe can be found in the contemporaneously filed U.S. patent application Ser. No. 07/320,314, referenced above, and entitled "Probe for Inspecting Countersunk Holes in Conductive Bodies."

Initially, the program instructs the processor 12 to open files and store user-supplied data. In accordance with the preferred embodiment of the invention, the user-supplied data includes: dimensions of the probe; dimensions of an ideal countersunk hold; distances between the probe and a surface of the ideal countersunk hole; and, manufacturing tolerances. Additional user-supplied data includes the number of measuring electrodes to be selected, denoted $C_{TOT}$, and the number of $S_{CNT}$ values to be read for each selected electrode, denoted $N_{TOT}$. In the present example, 100 $S_{CNT}$ values are read for each of the sixteen measuring electrodes in the probe (i.e., $C_{TOT} = 16$ and $N_{TOT} = 100$).

Next, the program determines whether a calibration file has been formed for the particular countersunk hole that is to be inspected. If a calibration file has been formed, the program proceeds to the next step. If a calibration file has not been formed, the program instructs the user to do so before proceeding to the next step. A calibration file is formed in the following manner. The fringe field capacitance probe is inserted into a calibrated countersunk hole having the same nominal dimensions as the countersunk hole to be inspected. Calibrated $S_{CNT}$ values are produced in the manner discussed above, and stored by the processor 12. The processor 12 sets up a table equating the calibrated $S_{CNT}$ values with the stored values of the distances between the probe and an ideal countersunk hold. This table forms the calibration file for the particular countersunk hole that is to be inspected. Corresponding calibration files are similarly formed and stored for each countersunk hole size that is to be inspected.

After the calibration file has been formed, the program instructs the processor 12 to initialize an electrode counter, C, (i.e., $C = 1$). Next, the processor selected the first measuring electrode and issues an appropriate control address, $S_{CTL}$, to the selector 16. As discussed above, the step causes the converter 14 to produce a $S_{CNT}$ value, which is applied to the processor 12. Once this step is completed, the program initializes a read counter, N (i.e., $N = 0$).

Next, the program instructs the processor 12 to read and store the $S_{CNT}$ value for the selected electrode. Once this $S_{CNT}$ value has been stored by the processor 12 the program increments the read counter (i.e., $N=N+1$). Next, the program determines whether an appropriate number of $S_{CNT}$ values for the selected electrode have been read (i.e., $N \geq N_{TOT}$, where $N_{TOT}=100$ in the present example). If the appropriate number of $S_{CNT}$ values have not been read, (i.e., $N<100$), then the program instructs the processor 12 to reselect the same electrode. The above steps are repeated until the appropriate number of $S_{CNT}$ values for the selected electrode have been read (i.e., $N=N_{TOT}$). When the appropriate number of $S_{CNT}$ values have been read for the selected electrode, the program proceeds to the next step.

Next, the program determines whether all of the measuring electrodes have been selected (i.e., $C \geq C_{TOT}$, where $C_{TOT}=16$ in the present example). If all of the electrodes have not been selected (i.e., $C<C_{TOT}$) the program increments the electrode counter (i.e., $C=C+1$) and instructs the processor 12 to select the next electrode. The read counter is initialized (i.e., $N=O$) and the $S_{CNT}$ values for the next selected electrode are read in the manner described above.

Once all of the measuring electrodes have been selected, the program instructs the processor 12 to translate the charge times (i.e., the $S_{CNT}$ values) into distance values. As discussed above, the translated distance values correspond to the distances between the probe and the nearby surface of the inspected countersunk hole. If multiple $S_{CNT}$ values have been read for each selected electrode, the processor computes average $S_{CNT}$ values. Next, the processor 12 translates the average $S_{CNT}$ values into distance values by comparing the average $S_{CNT}$ values to the calibrated $S_{CNT}$ values and their associated distance values in the calibration file. Once the $S_{CNT}$ values have been translated into distance values, the program proceeds to the next step.

Next, the program instruct the processor 12 to compute the dimensions of the inspected countersunk hole. The processor 12 uses a straightforward algorithm to compute these dimensions. The algorithm uses the previously translated distance values and the user supplied probe dimensions to compute the actual countersunk hole dimensions. As an example of a dimension computation, the program may add the diameter of the probe to appropriate distance values to obtain the diameter of the hole or countersink portion of the countersunk hole. In any event, the precise algorithm used by the processor 12 to compute the countersunk hole dimensions depends upon the arrangement of the measuring electrodes in the probe, and, thus, is not disclosed in detail, herein.

Next, the program determines whether the computed dimensions of the inspected countersunk hole are within engineering specifications. The program compares the computed dimensions with the previously stored ideal hole dimensions and manufacturing tolerances. If one or more of the computed countersunk hole dimensions are not within the specifications, the processor sends a REJECT message to the user. If all of the dimensions are within engineering specifications, the program instructs the processor 12 to proceed to the next step, which is to determine if the inspected countersunk hole has the proper geometry and orientation in the aircraft part.

During this step, the program uses the previously translated distance values to determine whether the inspected countersunk hole has the proper geometry and orientation within the aircraft part. For example, by comparing the translated distance values of selected electrodes that are diametrically opposite one another in the probe, it may be determined if there is an eccentricity problem with the countersunk hole. Such an eccentricity problem may arise if, for example, the axis of a countersink portion of the countersunk hole is not perpendicular to the surface of the conductive body into which it is drilled. An improper wall angle of the countersink portion of a countersunk hole is another example of a geometry and orientation problem that may be determined by comparing the appropriate translated distance values. More specifically, the translated distance values associated with axially spaced apart measuring electrodes may be compared to one another to determine if the wall angle of the countersink portion is proper. Other examples of geometry and orientation problems that may be determined from the previously translated distance values include depth of the countersink portion and alignment of the axes of the hole and countersink portions of the countersunk hole. The comparisons and analyses of the previously translated distance values discussed above are well known and straightforward to a person of ordinary skill in the inspection art. Accordingly, the specific comparisons and analyses of the translated distance values called for by this step of the program are not discussed herein.

When the processor 12 determines that the countersunk hole has the proper geometry and orientation, and ACCEPT message is issued. Thus, an ACCEPT message indicates, to the user, that the dimensions and the geometry and orientation of the inspected countersunk hole are within specifications. Contrariwise, if the processor 12 determines that the geometry and orientation is not proper, a REJECT message is issued. As noted above, in addition to the REJECT message, the processor 12 may issue an error message identifying the particular problem with the inspected countersunk hole, such as which dimension is outside the specification or the particular geometry and orientation problem. Once the ACCEPT or REJECT and error messages are issued, the program is exited and the next countersunk hole can be inspected in the manner set forth above.

As can be readily appreciated from the foregoing description, the present invention provides a method and apparatus for determining the distance between a capacitance-type sensing probe and the surface of a conductive body. While a preferred embodiment and various examples of the invention have been illustrated and discussed herein, it is to be understood that, within the scope of the appended claims, various changes can be made. For example, the invention can be used with any capacitance-type sensing probe, and is not limited to use with fringe field capacitance probes. Also, other circuit elements could be substituted for those discussed that would still permit the invention to determine the charge time of a capacitor formed by the probe and the surface of the conductive body being inspected. Hence, the invention can be practiced otherwise than as specifically described herein.

The embodiments of the invention in which an exclusive property or privilege is claimed are defined as follows:

1. An apparatus for measuring the distance between a capacitance-type sensing probe and a conductive body comprising:

(a) a capacitance-type sensing probe having a plurality of measuring electrodes and a ground electrode for grounding a conductive body;

(b) selecting means coupled to said capacitance-type sensing probe for selecting one of said plurality of measuring electrodes in said probe, said selected electrode forming a capacitor with the nearby surface of a conductive body when said capacitance-type sensing probe is placed near a surface of the conductive body;

(c) charging means for charging said capacitor associated with said selected electrode from a ground voltage to a capacitor charge voltage when said selected electrode is selected by said selecting means;

(d) timing means including a comparator coupled to said charging means for comparing said capacitor charge voltage to a threshold voltage, said comparator producing a first output when said capacitor charge voltage is less than said threshold voltage and a second output when said capacitor charge voltage is greater than or equal to said threshold voltage; a clock for producing clock pulses; and, a counter coupled to said comparator and to said clock for counting said clock pulses, such that said counter starts counting said clock pulses when said selecting means selects one of said plurality of measuring electrodes, stops counting said clock pulses when said comparator asserts said second signal and produces a digital clock-pulse count signal representative of the number of clock pulses counted; and, (e) a processor coupled to said selecting means and said counter, said processor issuing control instruction to said selecting means instructing said selecting means to select one of said plurality of measuring electrodes for charging and to couple said selected electrode to said comparator, said processor receiving said clock-pulse count signal from said counter and translating said clock-pulse count signal into a distance value related to the distance between said capacitance-type sensing probe and the nearby surface of the conductive body.

2. The apparatus for measuring the distance between a capacitance-type sensing probe and a conductive body claimed in claim 1, wherein said charging means comprises a charging circuit coupled to said selecting means and said timing means, said charging circuit applying a charging voltage to said selected electrode and charging up said capacitor associated with said selected electrode to said capacitor charge voltage.

3. The apparatus for measuring the distance between a capacitance-type sensing probe and a conductive body claimed in claim 1, wherein said selecting means comprises:

(a) a decoder coupled to said processor for decoding said control instructions and issuing a selection address; and, (b) a multiplexer coupled to said decoder and to said plurality of measuring electrodes and said grounding electrode in said capacitance-type sensing probe, said multiplexer receiving said selection address from said decoder and selecting one of said plurality of measuring electrodes, said multiplexer connecting said selected electrode to said charge means.

4. The apparatus for measuring the distance between a capacitance-type sensing probe and a conductive body claimed in claim 3, wherein said charging means comprises a charging circuit coupled to said selecting means and said timing means, said charging circuit applying a charging voltage to said selected electrode and charging up said capacitor associated with said selected electrode to said capacitor charge voltage.

5. The apparatus for measuring the distance between a capacitance-type sensing probe and a conductive body claimed in claim 1, wherein said capacitance-type sensing probe is a fringe field capacitance probe and said capacitor associated with said selected electrode is a fringe field capacitor.

6. The apparatus for measuring the distance between a capacitance-type sensing probe and a conductive body claimed in claim 5, wherein said charging means comprises a charging circuit coupled to said selecting means and said timing means, said charging circuit applying a charging voltage to said selected electrode and charging up said fringe field capacitor associated with said selected electrode to said capacitor charge voltage.

7. The apparatus for measuring the distance between a capacitance-type sensing probe and a conductive body claimed in claim 5, wherein said selecting means comprises:

(a) a decoder coupled to said processor for decoding said control instructions and issuing a selection address; and, (b) a multiplexer coupled to said decoder and to said plurality of measuring electrodes and said grounding electrode in said fringe field capacitance probe, said multiplexer receiving said selection address from said decoder and selecting one of said plurality of measuring electrodes, said multiplexer connecting said selected electrode to said charging means.

8. The apparatus for measuring the distance between a capacitance-type sensing probe and a conductive body claimed in claim 7, wherein said charging means comprises a charging circuit coupled to said selecting means and said timing means, said charging circuit applying a charging voltage to said selected electrode and charging up said fringe capacitor associated with said selected electrode to said capacitor charge voltage.

9. An apparatus for measuring the distance between a fringe field capacitance probe and the wall of a countersunk hole in a conductive body comprising:

(a) a fastener-shaped fringe field capacitance probe having a plurality of measuring electrodes and a grounding electrode, said grounding electrode contacting a wall of a countersunk hole in a conductive body and grounding the countersunk hole when said fastener-shaped fringe field capacitance probe is placed in the countersunk hole;

(b) selecting means coupled to said fastener-shaped fringe field capacitance probe for selecting one of said plurality of measuring electrodes in said fringe field capacitance probe, said selected electrode forming a fringe field capacitor with a grounded wall of the countersunk hole in the conductive body;

(c) charging means for charging said capacitor associated with said selected electrode from a ground voltage to a capacitor charge voltage when said selected electrode is selected by said selecting means;

(d) timing means including a comparator coupled to said charging means for comparing said capacitor charge voltage to a threshold voltage, said comparator producing a first output when said capacitor charge voltage is less than said threshold voltage and a second output when said capacitor charge voltage is greater than or equal to said threshold voltage; a clock for producing clock pulses; and, a counter coupled to said comparator and to said clock for counting said clock pulses, such that said counter starts counting said clock pulses when said selecting means selects one of said plurality of measuring electrodes, stops counting said clock pulses when said comparator asserts said second signal and produces a digital clock-pulse count signal representative of the number of clock pulses counted; and, (e) a processor coupled to said selecting means and said counter, said processor issuing control instructions to said selecting means instructing said selecting means to select one of said plurality of measuring electrodes for charging and to couple said selected electrode to said comparator, said processor receiving said clock-pulse count signal from said counter and translating said clock-pulse count signal into a distance value related to the distance between said capacitance-type sensing probe and the nearby surface of the conductive body.

10. The apparatus for measuring the distance between a fringe field capacitance probe and the wall of a countersunk hole claimed in claim 9, wherein said charging means comprises a charging circuit coupled to said selecting means and said timing means, said charging circuit applying a charging voltage to said selected electrode and charging up said fringe field capacitor associated with said selected electrode, to said capacitor charge voltage.

11. The apparatus for measuring the distance between a fringe field capacitance probe and the wall of a countersunk hole claimed in claim 9, wherein said selecting means comprises:

(a) a decoder coupled to said processor for decoding said control instructions and issuing a selection address; and, (b) a multiplexer coupled to said decoder and to said plurality of measuring electrodes and said grounding electrode in said fastener-shaped fringe field capacitance probe, said multiplexer receiving said selection address from said decoder and selecting one of said plurality of measuring electrodes, said multiplexer connecting said selecting electrode to said charging means.

12. The apparatus for measuring the distance between a fringe field capacitance probe and the wall of a countersunk hole claimed in claim 11, wherein said charging means comprises a charging circuit coupled to said selecting means and said timing means, said charging circuit applying a charging voltage to said selected electrode and charging up said fringe field capacitor associated with said selected electrode to said capacitor charge voltage.

13. A method of measuring the distance between a capacitance-type sensing probe and the surface of a conductive body, the sensing probe having a plurality of electrodes each forming a capacitor with the conductive body, comprising the steps of:

(a) selecting one of the sensing probe electrodes;

(b) grounding said selected electrode so as to establish a ground voltage across the capacitor formed by said selected electrode and the conductive body;

(c) applying a charge to said selected electrode so that a capacitor charge voltage develops on said selected electrode;

(d) counting clock pulses starting when said charge is applied to said selected electrode and stopping said counting of said clock pulses when said capacitor charge voltage is equal to or greater than a threshold voltage;

(e) producing a proportional digital time-related signal in the form of the number of said counted clock pulses; and (f) translating said proportional time-related signal into a distance value, said distance value corresponding to a distance between the capacitance-type sensing probe and the nearby surface of the conductive body.

14. The method of claim 13, further including holding the nonselected electrodes at ground potential when said charge is applied to said selected electrode.

* * * * *

UNITED STATES PATENT AND TRADEMARK OFFICE
CERTIFICATE OF CORRECTION

PATENT NO. : 5,021,740
DATED : June 4, 1991
INVENTOR(S) : D.P. Sarr et al.

It is certified that error appears in the above-identified patent and that said Letters Patent is hereby corrected as shown below:

| COLUMN | LINE | |
|---|---|---|
| 4 | 47 | "instruction" should read --instructions-- |
| 4 | 59 | after "applies" delete "to" |
| 4 | 60 | after "capacitor" delete "the" and insert therefor --to-- |
| 4 | 68 | "denote" should read --denoted-- |
| 8 | 55 | "hold" should read --hole-- |
| 9 | 40 | "instruct" should read --instructs-- |
| 10 | 30 | after "orientation," delete "and" and insert --an-- |
| 11 | 34 & 35 | "instruc-tion" should read --instructions-- |
| 11 | 65 | "charge" should read --charging-- |

Signed and Sealed this

Thirtieth Day of March, 1993

Attest:

STEPHEN G. KUNIN

*Attesting Officer*      *Acting Commissioner of Patents and Trademarks*